(12) United States Patent
Kim et al.

(10) Patent No.: US 8,111,102 B2
(45) Date of Patent: Feb. 7, 2012

(54) AUTO GAIN CONTROLLERS, AND COMMUNICATION TERMINALS HAVING THE SAME

(75) Inventors: In Hyuk Kim, Seoul (KR); Chol Su Yoon, Yongin-si (KR); Hang Seok Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/659,160

(22) Filed: Feb. 26, 2010

(65) Prior Publication Data

US 2010/0237943 A1  Sep. 23, 2010

(30) Foreign Application Priority Data

Mar. 23, 2009  (KR) .................. 10-2009-0024644

(51) Int. Cl.
*H03F 3/45* (2006.01)
(52) U.S. Cl. ........................................ 330/254; 330/279
(58) Field of Classification Search .......... 330/252–261, 330/278–279
See application file for complete search history.

(56) References Cited

U.S. PATENT DOCUMENTS 6,169,638 B1 * 1/2001 Morling .................... 360/46

FOREIGN PATENT DOCUMENTS

| JP | 2006-129234 | 5/2006 |
|---|---|---|
| KR | 10-2002-0035947 | 5/2002 |
| KR | 10-0426303 | 3/2004 |

* cited by examiner

*Primary Examiner* — Hieu Nguyen
(74) *Attorney, Agent, or Firm* — Harness, Dickey & Pierce, P.L.C.

(57) ABSTRACT

An auto gain controller is provided. The auto gain controller includes a variable gain amplification unit configured to receive differential input signals, adjust an amplification gain based on an auto gain control voltage and output differential output signals. The auto gain controller also includes a peak detector configured to detect at least one peak value among the amplified differential output signals, a comparator configured to compare the at least one detected peak value with a reference voltage and generate a comparison signal, and a voltage adjusting circuit configured to adjust the auto gain control voltage and the reference voltage based on the comparison signal.

6 Claims, 8 Drawing Sheets

AUTO GAIN CONTROLLERS, AND COMMUNICATION TERMINALS HAVING THE SAME

CROSS-REFERENCE TO RELATED APPLICATIONS

This nonprovisional U.S. application claims priority under 35 U.S.C. §119 to Korean Patent Application No. 10-2009-0024644, filed on Mar. 23, 2009, in the Korean Intellectual Property Office (KIPO), the entire contents of which are incorporated herein by reference.

BACKGROUND

Example embodiments of inventive concepts relate to a signal processing technique, and more particularly, to auto gain controllers capable of improving a receiving performance and communication terminals having the same.

In a wireless transceiver system using a non-contact IC card, e.g., a smart card, such as Near Field Communication (NFC), amplitude of a RF signal transmitted or received between the non-contact IC card and a reader may be changed variably according to a distance between the non-contact IC card and the reader. Accordingly, the non-contact IC card and the reader may reduce a signal distortion by converting and transmitting the RF signal by using an analog to digital converter. In this case, for fixing amplitude of the RF signal varied according to the distance within an input range of the analog to digital converter, an auto gain controller (AGC) is used.

The AGC is a device keeping amplitude of an output signal constantly by controlling gain of an amplifier automatically, and it may perform a regular output by forming feedback loop, which may adjust a gain according to an amplitude level of an input signal. A wireless communication system using such an auto gain controller requires predetermined time or locking time structurally until an output signal is kept regularly. That is, the AGC may be used only in a wireless communication system capable of transmitting a RF signal where a preamble signal is included to lock the auto gain controller.

Generally, a wireless communication system, which may not use the auto gain controller, amplifies a RF signal by using a fixed gain amplifier having a fixed gain. In such a wireless communication system, when a gain value of the fixed gain amplifier is set high or a RF signal larger than expected is input, an output signal is out of an operation range of an analog to digital converter. Additionally, when a gain value is set lower to prevent the problem, receive sensitivity of entire wireless communication system is deteriorated.

SUMMARY

Inventive concepts provide an auto gain controller capable of improving a receiving performance and a communication terminal including the auto gain controller. In addition, inventive concepts provide an auto gain controller capable of keeping amplitude of an output signal within a fixed range set in advance by resetting the auto gain control voltage automatically according to a result of monitoring an output signal whose gain is controlled according to an auto gain control voltage, a communication terminal including the auto gain controller and a signal processing method of the communication terminal.

An example embodiment is directed to an auto gain controller, including a variable gain amplification unit adjusting an amplification gain on differential input signals according to an auto gain control voltage and outputting differential output signals which are amplified according to an adjusted amplification gain, a peak detector for detecting at least one peak value among the amplified differential output signals, a comparator for comparing a detected peak value with a reference voltage and generating a comparison signal and a voltage adjusting circuit for adjusting the auto gain control voltage and the reference voltage according to the comparison signal.

The voltage adjusting circuit includes a first selection circuit for outputting one of a plurality of auto gain control voltages as the auto gain control voltage according to the comparison signal and a second selection circuit for selecting one of a plurality of reference voltages as the reference voltage according to the comparison signal.

Another example embodiment is directed to an auto gain controller, further including a control unit for generating a plurality of switching signals according to a mode selection signal and the comparison signal, and the voltage adjusting circuit, including an integrator for integrating the peak value according to the reference voltage, a first selection circuit for outputting one of a plurality of auto gain control voltages in response to a first switching signal among the plurality of switching signals, a second selection circuit for outputting one of a plurality of reference voltages as the reference voltage in response to a second switching signal among the plurality of switching signals, and a third selection circuit for outputting either an output voltage of the integrator or an output voltage of the first selection circuit as the auto gain control voltage in response to a third switching signal among the plurality of switching signals.

An example embodiment is directed to a communication terminal, including a receiving unit for receiving differential input signals, a variable gain amplification unit for adjusting an amplification gain on differential input signals according to an auto gain control voltage and outputting amplified differential output signals according to an adjusted amplification gain, a peak detector for detecting at least one peak value among the amplified differential output signals, a comparator for comparing a detected peak value with a reference voltage and generating a comparison signal, and a voltage adjusting circuit for adjusting the auto gain control voltage and the reference voltage based on the comparison signal.

According to an example embodiment, in a communication system including a first communication terminal outputting differential signals and a second communication terminal adjusting an amplification gain on differential input signals according to an auto gain control voltage and amplified outputting differential output signals according to an adjusted amplification gain, a method of outputting the amplified differential output signals includes detecting, by the second terminal, at least a peak value among the amplified differential output signals, comparing, by the second terminal, a peak value where the second communication terminal is detected with a reference voltage and generating a comparison signal, and controlling, by the second communication terminal, the auto gain control voltage and the reference voltage based on the comparison signal.

A method of outputting the amplified differential output signals further includes generating, by the second communication terminal, a plurality of switching signals according to a mode selection signal and the comparison signal, and adjusting the auto gain adjusting voltage and the reference voltage includes integrating, by the second communication terminal, the peak value according to the reference voltage by using an integrator, outputting, by the communication terminal, one of a plurality of auto gain control voltages in response to a first switching signal among the plurality of switching signals by using a first selection circuit, outputting, by the communication terminal, one of a plurality of reference voltages as the reference voltage in response to a second switching signal among the plurality of switching signals by using a second selection circuit, and outputting, by the communication terminal, one of an output voltage of the integrator and an output voltage of the first selection circuit as the auto gain control voltage in response to a third switching signal among the plurality of switching signals by using a third selection circuit.

At least another example embodiment provides an auto gain controller including a variable gain amplification unit configured to receive differential input signal, adjust an amplification gain based on an auto gain control voltage and output differential output signals amplified based on the adjusted amplification gain, and an auto gain adjusting circuit configured to detect at least one peak value of the differential output signals, compare the at least one detected peak value with a reference voltage, generate a comparison signal and adjust the auto gain control voltage and the reference voltage based on the comparison signal.

According to at least one example embodiment a communication terminal includes a receiving unit configured to receive differential input signals, a variable gain amplification unit configured to receive differential input signal, adjust an amplification gain based on an auto gain control voltage and output differential output signals amplified based on the adjusted amplification gain, and an auto gain adjusting circuit configured to detect at least one peak value of the differential output signals, compare the at least one detected peak value with a reference voltage, generate a comparison signal and adjust the auto gain control voltage and the reference voltage based on the comparison signal.

BRIEF DESCRIPTION OF THE DRAWINGS

These and/or other aspects and advantages of inventive concepts will become apparent and more readily appreciated from the following description of example embodiments, taken in conjunction with the accompanying drawings of which.

DETAILED DESCRIPTION OF EXAMPLE EMBODIMENTS

Figure 1:
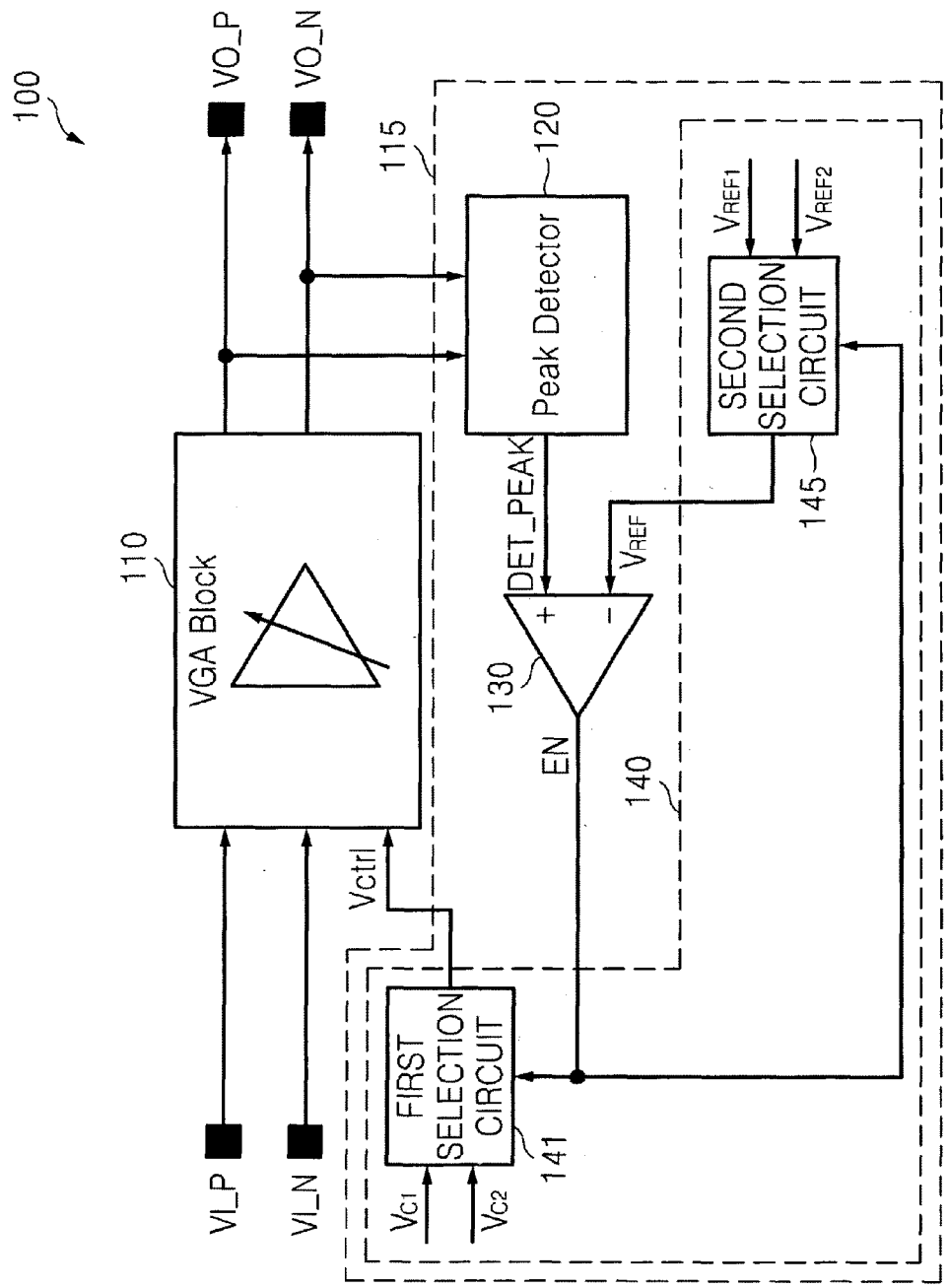
FIG. 1 shows a block diagram of an auto gain controller according to an example embodiment.

Example embodiments of inventive concepts will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises", "comprising", "includes", and/or "including" if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows a block diagram of an auto gain controller (AGC) according to an example embodiment. Referring to FIG. 1, the auto gain controller 100 includes a variable gain amplification unit 110 and an auto gain adjusting circuit 115.

FIG. 1 illustrates the auto gain controller 100 adjusting an amplification gain of a variable gain amplification unit 110 by outputting selectively one of two control voltages, e.g., a first control voltage Vc1 and a second control voltage Vc2, having a different level respectively as an auto gain control voltage Vctrl for an ease of explanation, however, example embodiments should not be restricted to the number of control voltages. A control voltage generator may generate that the first and second control voltages Vc1 and Vc2.

The variable gain amplification unit 110 may receive an auto gain control voltage Vctrl and differential input signals VI_P and VI_N input through a receiving unit, e.g., input terminals, adjust an amplification gain on received differential input signals VI_P and VI_N according to the auto gain control voltage Vctrl and generate amplified differential output signals VO_P and VO_N according to an adjusted amplification gain.

The variable gain amplification unit 110 may be embodied as a variable gain amplifier (VGA) and the VGA is an example of an amplifier, which may adjust an amplification gain on input signals VI_P and VI_N according to an adjustable auto gain control voltage Vctrl automatically. For example, the variable gain amplification unit 110 may decrease amplitude of amplified differential output signals VO_P and VO_N by lowering an amplification gain of the variable gain amplification unit 110 according to the auto gain control voltage Vctrl when amplitude of differential input signals VI_P and VI_N is large. The variable gain amplification unit 110, when amplitude of the differential input signals VI_P and VI_N is small, may increase amplitude of amplified differential output signals VO_P and VO_N by increasing an amplification gain of the variable gain amplification unit 110 according to the auto gain control voltage Vctrl.

The auto gain adjusting circuit 115 may include a peak detector 120, a comparator 130 and a voltage adjusting circuit 140. The peak detector 120 may detect at least one peak value DET_PEAK among differential output signals VO_P and VO_N output from the variable gain amplification unit 110.

The comparator 130 may receive the peak value DET_PEAK detected by the detector 120 and a reference voltage $V_{REF}$, compare the received peak value DET_PEAK with the reference voltage $V_{REF}$ and output a comparison signal EN according to a comparison result. For example, the comparator 130 may output a comparison signal EN having a first logic level, e.g., a low level, when the peak value DET_PEAK is lower than the reference voltage $V_{REF}$, and output a comparison signal EN having a second logic level, e.g., a high level, when the peak value DET_PEAK is higher than the reference voltage $V_{REF}$.

Here, the comparison signal EN output from the comparator 130 may be used as a first selection signal for controlling an operation of a first selection circuit 141 or a second selection signal for controlling an operation of a second selection circuit 145.

The voltage adjusting circuit 140 may include the first selection circuit 141 and the second selection circuit 145. The first selection circuit 141 may output one of a first control voltage Vc1 and a second control voltage Vc2 to the variable gain amplification unit 110 as the auto gain control voltage Vctrl in response to a comparison signal EN output from the comparator 130. That is, an amplification gain of the variable gain amplification unit 110 operating in response to the first control voltage Vc1 is different from an amplification gain of the variable gain amplification unit 110 operating in response to the second control voltage Vc2.

The second selection circuit 145 may output one of a first reference voltage $V_{REF1}$ and a second reference voltage $V_{REF2}$ as a reference voltage $V_{REF}$ in response to a comparison signal EN output from the comparator 130. Accordingly, a reference voltage $V_{REF}$ output from the second selection circuit 145 may affect a comparison signal EN output from the comparator 130.

Figure 2:
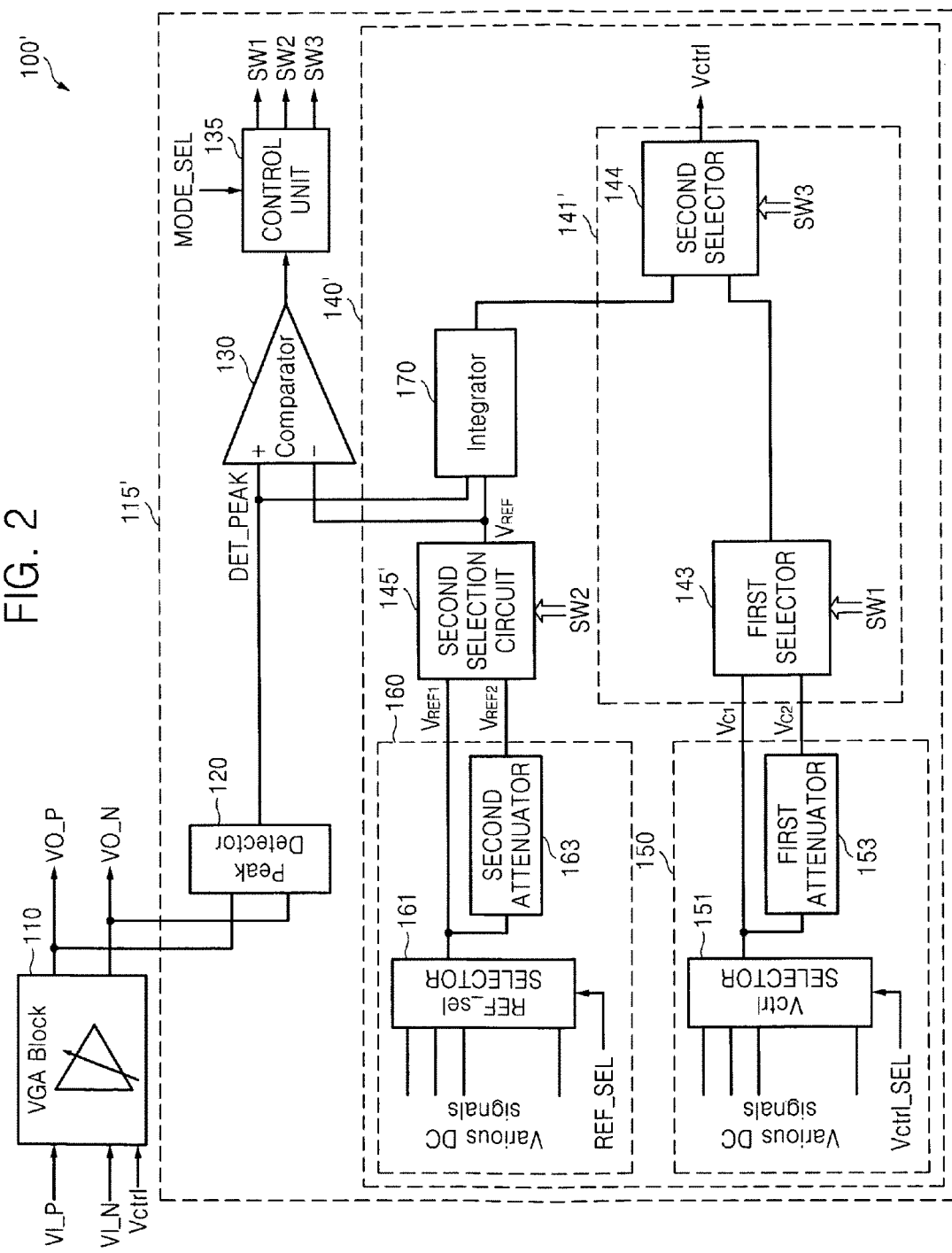
FIG. 2 shows a block diagram of an auto gain controller according to another example embodiment.

FIG. 2 shows a block diagram of an auto gain controller according to another example embodiment. Referring to FIG. 2, an auto gain controller 100' may include an auto gain adjusting circuit 115' having the peak detector 120, the comparator 130, a control unit 135, and a voltage adjusting circuit 140'.

The control unit 135 may generate a plurality of switching signals SW1, SW2 and SW3 according to combination of a mode selection signal MODE_SEL input from outside and a comparison signal output from the comparator 130. The voltage adjusting circuit 140' may include a first selection circuit 141', a second selection circuit 145', a control voltage generator 150, a reference voltage generator 160, and an integrator 170. The control voltage generator 150 may include a control voltage selector 151 and a first attenuator 153. For example, the control voltage generator 150 has a structure in which a plurality of control voltages having different levels, respectively, may be generated.

The control voltage selector 151 may select one of a plurality of voltages, e.g., DC signals, in response to a control voltage selection signal Vctrl_SEL and output a selected voltage as a first control voltage Vc1. The first attenuator 153 may attenuate amplitude of the first control voltage Vc1 output from the control voltage selector 151 as much as predetermined amplitude and output an attenuated voltage as a second control voltage Vc2. According to example embodiments, more attenuators may be used to generate more control voltages. The control voltage generator 150 may be embodied as a resistor string including a plurality of resistors connected in series.

The first selection circuit 141' may include a first selector 143 and a second selector 144. The first selector 143 may output one of a plurality of gain control voltages, e.g., a first control voltage Vc1 and a second control voltage Vc2 lower than the first control voltage Vc1, in response to the first selection signal SW1.

The reference voltage generator 160 may include a reference voltage selector 161 and a second attenuator 163. The reference voltage generator 160 may generate a plurality of reference voltages having different levels.

The reference voltage selector 161 may select one of a plurality of reference voltages, e.g., DC signals, in response to a reference voltage selection signal REF_SEL and output a selected reference voltage as a first reference voltage $V_{REF1}$. The second attenuator 163 attenuates amplitude of the first reference voltage $V_{REF1}$ output from the reference voltage selector 161 as much as predetermined amplitude and outputs an attenuated voltage as a second reference voltage $V_{REF2}$. According to example embodiments, more attenuators may be used to generate more reference voltages. Moreover, the reference voltage generator 160 may be embodied as a resistor string including a plurality of resistor connected in series.

The second selection circuit 145' may output one of a plurality of reference voltages, e.g., the first reference voltage $V_{REF1}$ and the second reference voltage $V_{REF2}$ lower than the first reference voltage $V_{REF1}$, as a reference voltage $V_{REF}$ in response to the second selection signal SW2.

The integrator 170 may integrate a peak value DET_PEAK according to the reference voltage $V_{REF}$ output from the second selection circuit 145'. An operation of the integrator 170 will be described later.

The second selector 144 may output either an output voltage of the integrator 170 or an output voltage of the first selector 143 to the variable gain amplification unit 110, as an auto gain control voltage Vctrl according to a third switching signal SW3. Accordingly, the variable gain amplification unit may adjust an amplification gain according to the auto gain control voltage Vctrl.

In other words, the auto gain controllers 100 and 100' according to example embodiments adjust an amplification gain of the variable gain amplification unit 110 by resetting or changing at least one of the auto gain control voltage Vctrl and the reference voltage Vref according to a result of monitoring at least one of output signals VO_P and VO_N of the variable gain amplification unit 110, e.g., a result of detecting a peak value, and a control mode selected according to at least one of mode selection signals MODE_SEL.

For example, when the peak value DET_PEAK output from the peak detector 120 becomes higher than the reference voltage Vref, the voltage adjusting circuit 140 may make the variable gain amplification unit 110 operate with a lower amplification gain (sometimes with a higher amplification gain) by changing the auto gain control voltage Vctrl from a first control voltage Vc1 to a second control voltage Vc2 based on a comparison signal output from the comparator 130. In addition, the voltage control circuit 140 may make the variable gain amplification unit 110 operate with a higher amplification gain (sometimes with a lower amplification gain) by changing the auto gain control voltage Vctrl from the second control voltage Vc2 to the first control voltage Vc1.

For example, the voltage adjusting circuit 140 or 140' may decrease or increase a level of the auto gain control voltage Vctrl and a level of the reference voltage $V_{REF}$ together.

Figure 3A:
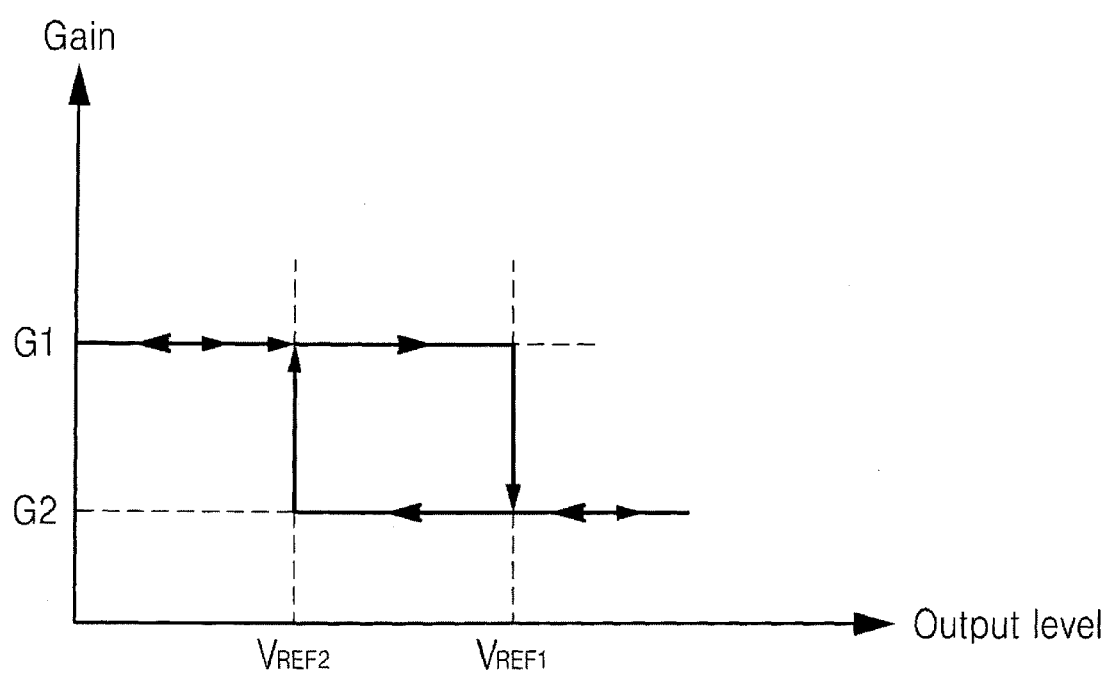
FIG. 3A is a graph for explaining a process where a gain is adjusted automatically by a change of a reference voltage according to an example embodiment.
Figure 3B:
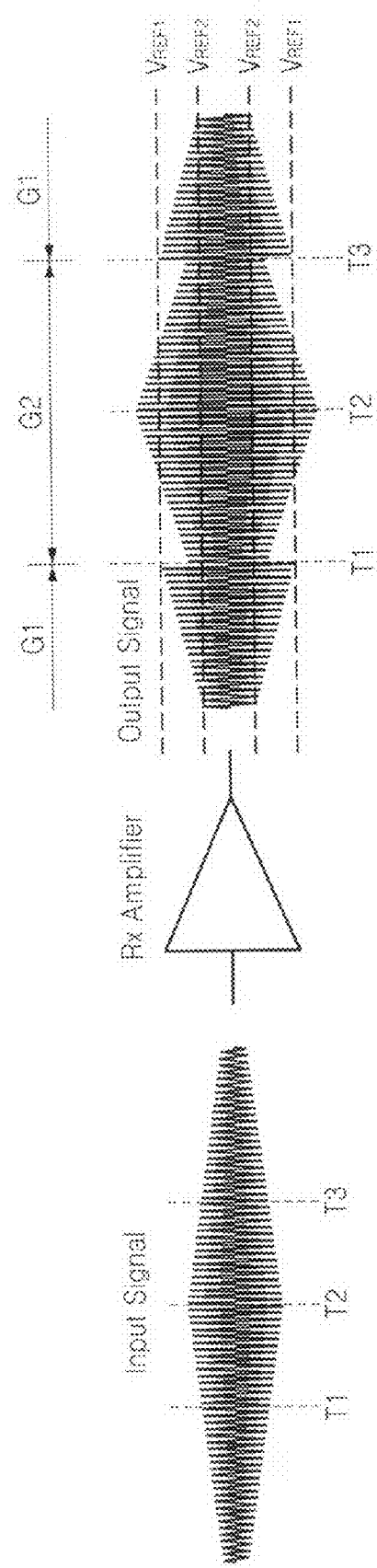
FIG. 3B shows an example of a waveform diagram of an input signal and an output signal of an auto gain controller operating in a switching gain control mode according to an example embodiment.
Figure 3C:
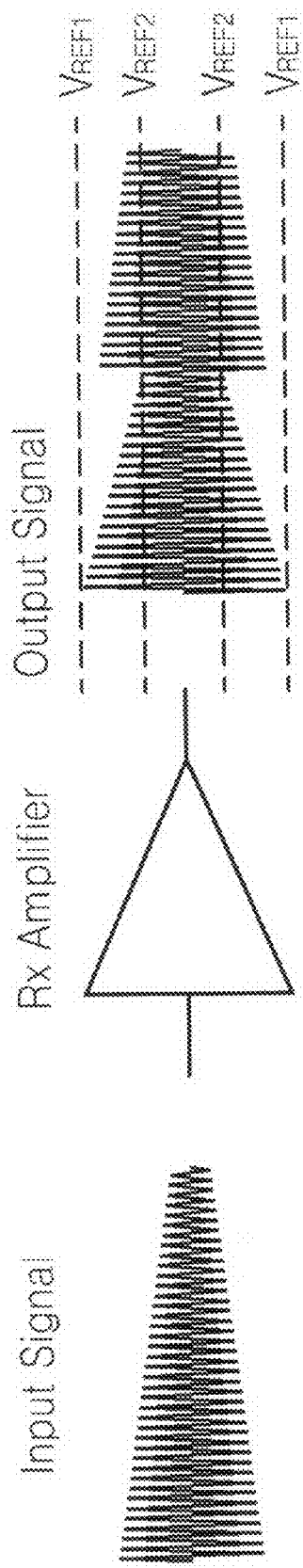
FIG. 3C shows another example of a waveform diagram of an input signal and an output signal of an auto gain controller according to an example embodiment.
Figure 4:
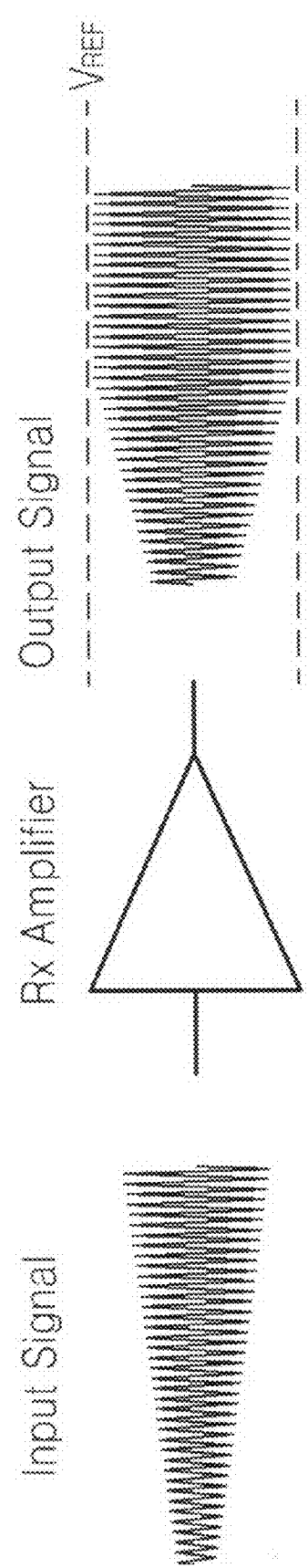
FIG. 4 shows a waveform diagram of an input signal and an output signal of an auto gain controller operating in an auto gain control mode according to an example embodiment.
Figure 5:
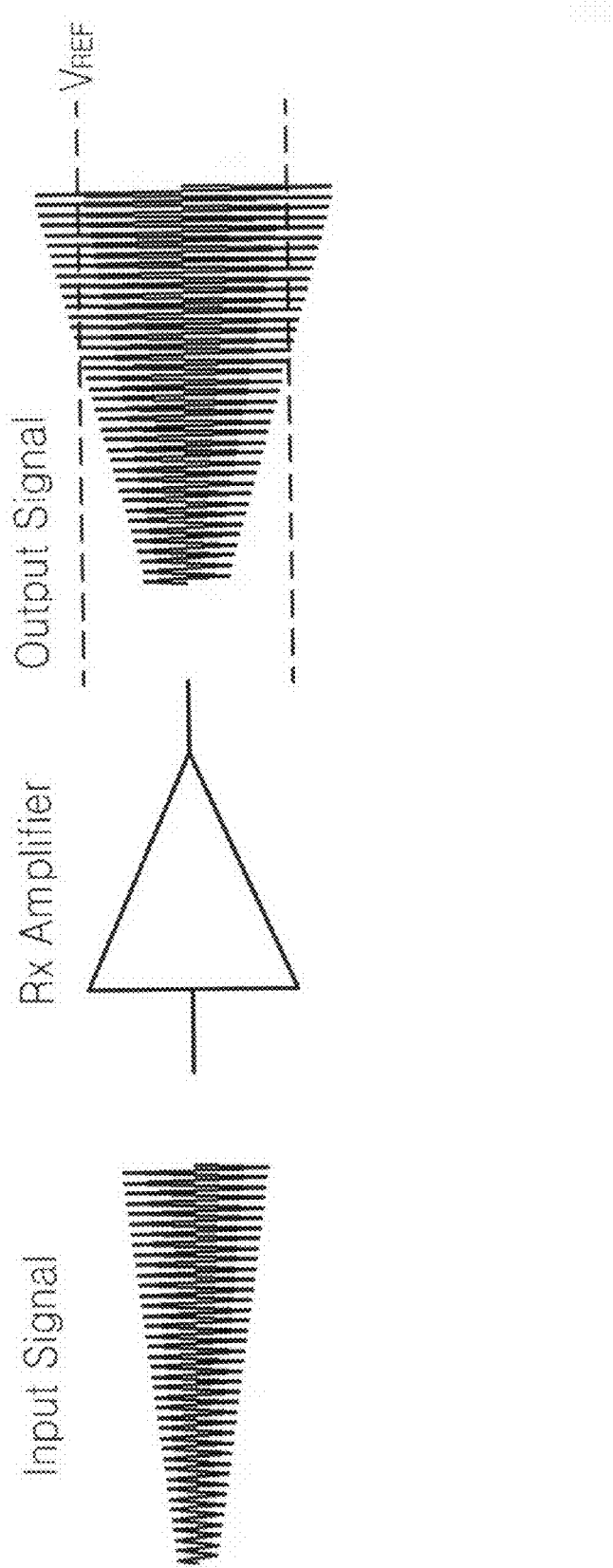
FIG. 5 shows a waveform diagram of an input signal and an output signal of an auto gain controller operating in a fixed gain control mode according to an example embodiment.

FIG. 3A is a graph for explaining a process where a gain is adjusted automatically by a change of a reference voltage according to example embodiments. FIG. 3B shows an example of a waveform diagram of an input signal and an output signal of an auto gain controller operating in a switching gain control mode. FIG. 3C shows another example of a waveform diagram of an input signal and an output signal of an auto gain controller. FIG. 4 shows a waveform diagram of an input signal and an output signal of an auto gain controller operating in an auto gain control mode. FIG. 5 shows a waveform diagram of an input signal and an output signal of an auto gain controller operating in a fixed gain control mode. An Rx amplifier illustrated in FIGS. 3B to 5 may be the gain amplification unit 110 illustrated in FIGS. 1 and 2.

Referring to FIGS. 1 to 3B, an operation of an auto gain controller 100 is explained as follows. However, it should be understood the operations illustrated in FIGS. 3A and 3B may be used to describe the auto gain controller 100'. As illustrated in FIG. 3A, the auto gain controller 100 or 100' may change or adjust a level of an auto gain control voltage Vctrl and a level of a reference voltage $V_{REF}$ together according to an output signal EN of a comparator 130. To explain more specifically, the auto gain controller 100 or 100' may adjust an amplification gain of a variable gain amplification unit 110, for example, to a first gain G1 or a second gain G2 smaller than the first gain G1.

The voltage adjusting circuit 140 may adjust or regulate an amplification gain of the variable gain amplification unit 110 to the first gain G1 or the second gain G2 according to a result of monitoring at least one of output signals VO_P and VO_N of the variable gain amplification unit 110 (or a result of detecting a peak value), for example, by changing an auto gain control voltage Vctrl when a peak value DET_PEAK reaches a reference voltage $V_{REF}$.

For example, when the peak value DET_PEAK output from the detector 120 reaches a first reference voltage $V_{REF1}$, the voltage adjusting circuit 140, by changing the auto gain control voltage Vctrl to the second control voltage Vc2 lower than the first control voltage Vc1 simultaneously with the reference voltage $V_{REF}$ to the second reference voltage $V_{REF2}$ lower than the first reference voltage $V_{REF1}$, may change an amplification gain of the variable gain amplification unit 110 from the second gain G2 to the first gain G1.

Moreover, when the peak value DET_PEAK output from the detector 120 reaches the second reference voltage $V_{REF2}$, the voltage adjusting circuit 140, by changing the auto gain control voltage Vctrl to the first control voltage Vc1 higher than the second control voltage Vc2 simultaneously with the reference voltage $V_{REF}$ to the first reference voltage $V_{REF1}$ higher than the second reference voltage $V_{REF2}$, may change an amplification gain of the variable gain amplification unit 110 from the first gain G1 to the second gain G2. Accordingly, the auto gain controller 100 or 100' may change the reference voltage $V_{REF}$ when the auto gain control voltage Vctrl is changed.

As described above, the auto gain controller 100 may detect a change of an input signal through the voltage adjusting circuit 140 and adjust an amplification gain of the variable gain amplification unit 110 by resetting or changing the auto gain control voltage Vctrl and the reference voltage $V_{REF}$ according to a detection result.

Referring to FIG. 2 again, the auto gain controller 100' may adjust an amplification gain of the variable gain amplification unit 110 by using one of a plurality of operational modes.

The peak detector 120 may detect at least one peak value DET_PEAK among differential output signals VO_P and VO_N output from the variable gain amplification unit 110 and the comparator 130 may compare the peak value DET_PEAK output from the peak detector 120 with the reference voltage $V_{REF}$ output from the voltage adjusting circuit 140' and output a comparison signal according to a comparison result.

The control unit 135 may generate a plurality of control signals, e.g., a first selection signal SW1, a second selection signal SW2 and the third selection signal SW3, according to combination of a mode selection signal MODE_SEL for controlling an operational mode of the auto gain controller 100' and a comparison signal output from the comparator 130. For example, the mode selection signal MODE_SEL may be an N-bit signal, where N is a natural number.

Here, the first selection signal SW1 may be a selection signal for controlling an operation of a first selector 143, the second selection signal SW2 may be a selection signal for controlling an operation of a second selection circuit 145', and the third selection signal SW3 may be a selection signal for controlling an operation of a second selector 144. Here, the mode selection signal MODE_SEL may be determined variously based on setting of a Special Function Resistor (SFR) (not shown) by user's selection.

The integrator 170 may receive a peak value DET_PEAK output from the detector 120 and the reference voltage $V_{REF}$ output from the second selection circuit 145' and output an output voltage generated according to the peak value DET_

PEAK and the reference voltage $V_{REF}$, which are received. Here, an output voltage of the integrator 170, when the peak value DET_PEAK is lower (or, smaller) than the reference voltage $V_{REF}$, may be getting increased, e.g., charged, as time goes by, and may be getting decreased, e.g., discharged, as time goes by when the peak value DET_PEAK is higher (or, larger) than the reference voltage $V_{REF}$. According to example embodiments, it may be embodied in an opposite way.

Accordingly, the integrator 170 may generate an output voltage adjusted automatically according to a change of differential input signals VI_P and VI_N, and, according to a voltage Vctrl output from the second selector 144, an amplification gain of the variable gain amplification unit 110 may also be automatically adjusted according to a change of the differential input signals VI_P and VI_N.

The auto gain controller 100' may operate in one of a plurality of operational modes, e.g., a switching gain control mode, an auto gain control mode and a fixed gain control mode, based on a mode selection signal MODE_SEL. Each of the plurality of operational modes may be reflected on each level of a plurality of switching (or, selection) signals SW1, SW2 and SW3.

When the auto gain controller 100' operates in a switching gain control mode according to a mode selection signal MODE_SEL, an amplification gain of the variable gain amplification unit 110 may be changed according to amplitude level of an input signal. In this case, as illustrated in FIG. 3B, the auto gain controller 100' may get a gain-adjusted output signal.

As illustrated in FIG. 3B, until a time point of T1, i.e., until a peak value DET_PEAK reaches a first reference voltage $V_{REF1}$, the gain amplification unit 110 may amplify an input signal with a first gain G1. A gain of the gain amplification unit 110 lowers from a first gain G1 to a second gain G2 at a time point of T1 according to an auto gain control voltage Vctrl. Until the peak value DET_PEAK reaches a second reference voltage $V_{REF2}$, i.e., from a time point of T1 to a time point of T3, the gain amplification unit 110 may amplify an input signal with the second gain G2. At a time point when the peak value DET_PEAK is lower than the second reference voltage $V_{REF2}$, T3, a gain of the gain amplification unit 110 becomes higher from the second gain G2 to the first gain G1 according to the auto gain control voltage Vctrl. Accordingly, the gain amplification unit 110 may amplify an input signal with the first gain G1.

Additionally, as illustrated in FIG. 3C, when the peak value DET_PEAK is lower than the first reference voltage $V_{REF1}$ and higher than the second reference voltage $V_{REF2}$, the gain amplification unit 110 may amplify an input signal with the second gain G2. When the peak value DET_PEAK becomes lower than the second reference voltage $V_{REF2}$, a gain of the gain amplification unit 110 becomes higher from the second gain G2 to the first gain G1 according to the auto gain control voltage Vctrl. Accordingly, while the peak value DET_PEAK is higher than the second reference voltage $V_{REF2}$ and lower than the first reference voltage $V_{REF1}$, the gain amplification unit 110 may amplify an input signal with the second gain G2.

As explained referring to FIGS. 3A to 3B, during a section where the peak value DET_PEAK is lower than the first reference voltage $V_{REF1}$, the gain amplification unit 110 may amplify an input signal with the first gain G1. From when the peak value DET_PEAK becomes higher than the first reference voltage $V_{REF1}$ to when the peak value DET_PEAK becomes lower than the second reference voltage $V_{REF2}$, a gain of the gain amplification 110 is changed from the first gain G1 to the second gain G2 and the gain amplification 110 may amplify an input signal with the second gain G2. For example, as illustrated in FIG. 3A, a gain change on a change of an output voltage, i.e., the peak value DET_PEAK, may have a property of hysteresis.

When the auto gain controller 100' operates in an auto gain control mode according to a mode selection signal MODE_SEL, a second selector 144 may output an output voltage of the integrator 170 as the auto gain control voltage Vctrl in response to a third selection signal SW3. In this case, as illustrated in FIG. 4, the auto gain controller 100' may keep amplitude level of an output signal within a range of a reference voltage $V_{REF}$ constantly by adjusting an amplification gain of the variable gain amplification unit 110 automatically according to a change of an input signal.

When the auto gain controller 100 operates in a fixed gain control mode according to the mode selection signal MODE_SEL, the first selector 143 may output one of a first control voltage Vc1 and a second control voltage Vc2, e.g., the first control voltage Vc1, in response to a first selection signal SW1, and the second selector 144 may output the first control voltage Vc1 as the auto gain control voltage Vctrl in response to a third selection signal SW3. In other words, by outputting, by the auto gain controller 100', a voltage to the variable gain amplification unit 110 as the auto gain control voltage Vctrl regardless of a change of an input signal, the variable gain amplification unit 110 may be used as an amplifier having a fixed amplification gain.

As illustrated in FIG. 5, when the auto gain controller 100 or 100' amplifies an input signal by using a fixed amplification gain of the variable gain amplification unit 110, amplitude of an output signal is getting increased as amplitude of an input signal is increased.

Figure 6:
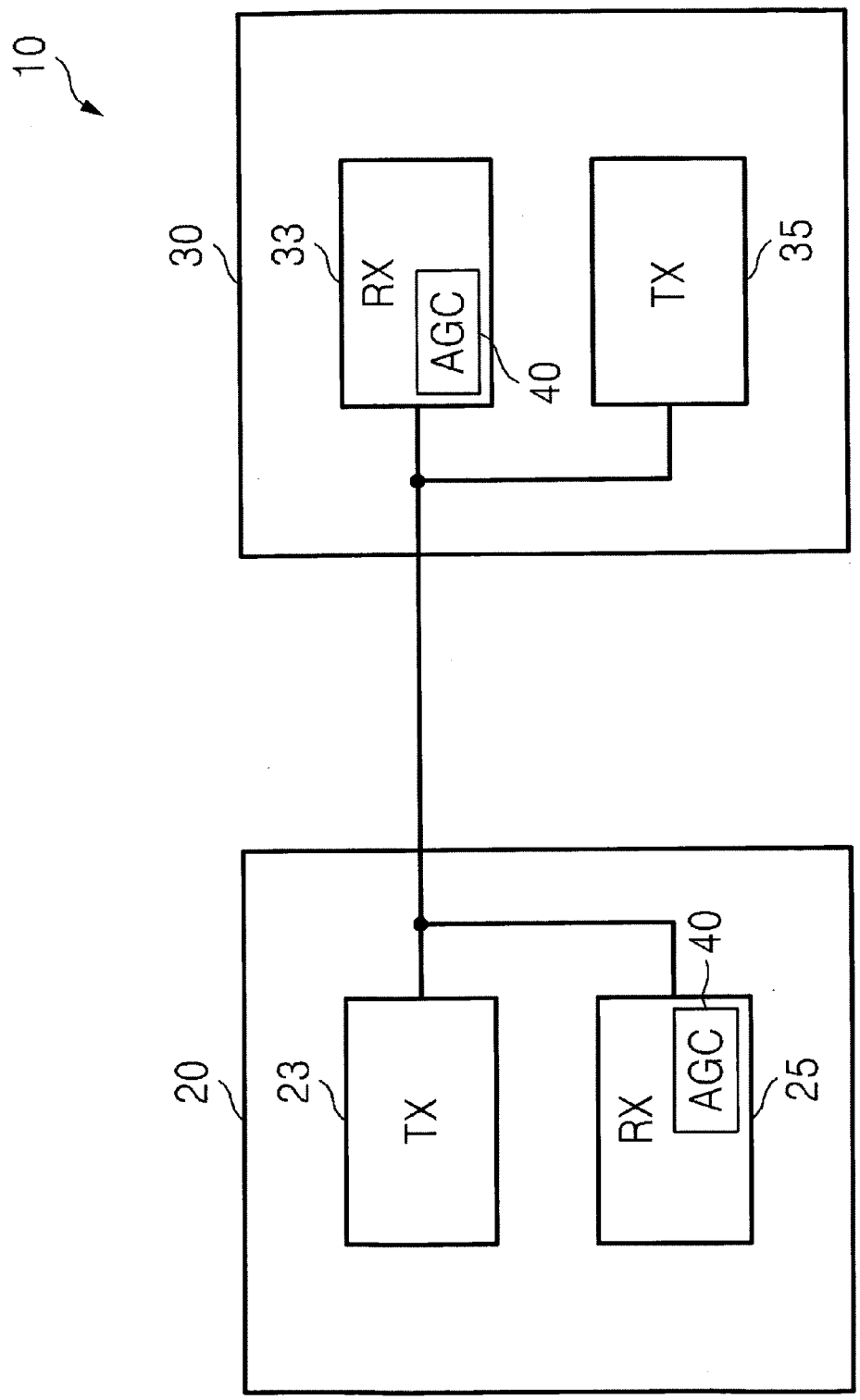
FIG. 6 shows a block diagram of a communication system including communication terminals according to an example embodiment.

FIG. 6 shows a block diagram of a communication system including communication terminals according to an example embodiment. Referring to FIG. 6, the wireless communication system 10 may include a first communication terminal 20 and a second communication terminal 30.

The first communication terminal 20 may be a first NFC module 20 and the second communication terminal 30 may be a second NFC module 30. For example, when the first communication terminal 20 operates as a reader, the second NFC module 30 may operate as a non-contact IC card or tag. On the contrary, the first communication terminal 20 may operate as a non-contact IC card and the second communication terminal 30 may operate as a reader.

The first communication terminal 20 and the second communication terminal 30 may be embodied as a non-contact IC card, e.g., a smart card, respectively, and in this case, the wireless communication system 10 may perform a communication operation by using a protocol such as ISO 14443 TYPE A, ISO 14443 TYPE B, ISO 15693, or Felica.

The first NFC module 20 may include a transmission unit 23 for transmitting a first RF signal and a receiving unit 25 for receiving a second RF signal transmitted from outside, and the second NFC module 30 may include a transmission unit 35 for transmitting the second RF signal and a receiving unit 33 for receiving the first RF signal transmitted from outside.

Each transmission unit 23 and 35 may decode data stored in each NFC module 20 and 30 to data in a protocol standard, converts each decoded data or data packet to each RF signal and output it to outside. Each receiving unit 25 and 33 may receive each RF signal transmitted from outside, encode each received RF signal to data meeting a protocol standard and generate encoded data.

While the first RF signal or the second RF signal is transmitted from a transmission unit 23 or 35 to a receiving unit, amplitude of the first RF signal or the second RF signal received in the receiving unit 33 is reduced by path loss occurred on a channel path, so that it can be weak.

As shown, each of the receiving units 25 and 33 include an auto gain controller 40, which may be the auto gain controller 100 or 100'. Accordingly, the receiving unit 25 or 33 may adjust amplitude of the first RF signal or the second RF signal, which is input during a receiving operation, not to be weak or extremely large by using the auto gain controller 100 or 100'. That is, in the wireless communication system 10 using a protocol such as ISO 14443 TYPE B or Felica, the auto gain controller 100 or 100' may keep amplitude level of an output signal constantly by operating in an auto gain control mode.

Additionally, in the wireless communication system 10 using a protocol such as ISO 14443 TYPE A or 15693, the auto gain controller 100 or 100' according to example embodiments may adjust amplitude level of an output signal by operating in a switching gain control mode or a fixed gain control mode.

As described above, the auto gain controller 100 or 100' may adjust an amplification gain of an input signal in all wireless communication system regardless of a kind of protocol since it may operate in one of the auto gain control mode, the fixed gain control mode and the switching gain control mode selectively. That is, the wireless communication system 10 according to an example embodiment may provide a receiving performance improved compared to a conventional communication system regardless of a kind of protocol by using the auto gain controller 100 or 100', which may use one of a plurality of operational modes selectively according to an user's selection.

In addition, the wireless communication system 10 may be easily embodied only with hardware without developing software such as a program or an algorithm for controlling a gain of the auto gain controller 100 or 100' according to an operational mode.

An auto gain controller according to example embodiments and a wireless communication system including the same may keep amplitude level of an output signal within an acceptable range set in advance by resetting the auto gain control voltage automatically according to a result of monitoring an output signal whose gain is controlled according to an auto gain control voltage, and accordingly, it may improve receive sensitivity of the wireless communication system.

Although example embodiments of inventive concepts have been shown and described, it will be appreciated by those skilled in the art that changes may be made in example embodiments without departing from the principles and spirit of inventive concepts, the scope of which is defined in the appended claims and their equivalents.

What is claimed is:

1. An auto gain controller comprising:
    a variable gain amplification unit configured to receive differential input signals, adjust an amplification gain based on an auto gain control voltage and output differential output signals amplified based on the adjusted amplification gain; and
    an auto gain adjusting circuit configured to detect at least one peak value of the differential output signals, compare the at least one detected peak value with a reference voltage, generate a comparison signal based on the at least one detected peak value and the reference voltage, and adjust the auto gain control voltage based on the comparison signal, the auto gain adjusting circuit including,
        a voltage adjusting circuit configured to adjust the auto gain control voltage and the reference voltage based on the comparison signal, the voltage adjusting circuit including,
            a first selection circuit configured to receive a plurality of control voltages and output one of the plurality of control voltages as the auto gain control voltage based on the comparison signal, and
            a second selection circuit configured to receive a plurality of reference voltages and output one of the plurality of reference voltages as the reference voltage based on the comparison signal.

2. The auto gain controller of claim 1, wherein the auto gain adjusting circuit includes,
    a peak detector configured to detect the at least one peak value of the differential output signals; and
    a comparator configured to compare the at least one detected peak value and the reference voltage and output the comparison signal based on the at least one detected peak value and the reference voltage.

3. A communication terminal comprising:
    a receiving unit configured to receive differential input signals;
    a variable gain amplification unit configured to receive differential input signals, adjust an amplification gain based on an auto gain control voltage and output differential output signals amplified based on the adjusted amplification gain; and
    an auto gain adjusting circuit configured to detect at least one peak value of the differential output signals, compare the at least one detected peak value with a reference voltage, generate a comparison signal based on the at least one detected peak value and the reference voltage, and adjust the auto gain control voltage and the reference voltage based on the comparison signal, wherein the auto gain adjusting circuit includes,
        a voltage adjusting circuit configured to adjust the auto gain control voltage and the reference voltage based on the comparison signal, the voltage adjusting circuit including,
            a first selection circuit configured to receive a plurality of control voltages and output one of the plurality of control voltages as the auto gain control voltage based on the comparison signal, and
            a second selection circuit configured to receive a plurality of reference voltages and output one of the plurality of reference voltages as the reference voltage based on the comparison signal.

4. The communication terminal of claim 3, wherein the auto gain adjusting circuit includes,
    a peak detector configured to detect the at least one peak value of the differential output signals; and
    a comparator configured to compare the at least one detected peak value and the reference voltage and output the comparison signal based on the at least one detected peak value and the reference voltage.

5. An auto gain controller comprising:
    a variable gain amplification unit configured to receive differential input signals, adjust an amplification gain based on an auto gain control voltage and output differential output signals amplified based on the adjusted amplification gain; and
    an auto gain adjusting circuit configured to detect at least one peak value of the differential output signals, compare the at least one detected peak value with a reference voltage, generate a comparison signal based on the at least one detected peak value and the reference voltage, and adjust the auto gain control voltage based on the comparison signal, wherein the auto gain adjusting circuit includes,
 a voltage adjusting circuit configured to adjust the auto gain control voltage and the reference voltage based on the comparison signal, and
 a control unit configured to receive the comparison signal and a mode selection signal and output a plurality of switching signals based on the mode selection signal.

6. The auto gain controller of claim 5, wherein the voltage adjusting circuit includes,
 an integrator configured to integrate the at least one detected peak value and the reference voltage;
 a first selector configured to output one of a plurality of auto gain control voltages based on a first switching signal of the plurality of switching signals; and
 a second selection circuit configured to output one of a plurality of reference voltages as the reference voltage based on a second switching signal of the plurality of switching signals; and
a second selector configured to receive an output voltage of the integrator and an output voltage of the first selector and output one of the output voltage of the integrator and the output voltage of the first selector as the auto gain control voltage based on a third switching signal of the plurality of switching signals.

* * * * *